United States Patent [19]
Okino

[11] Patent Number: 4,810,603
[45] Date of Patent: Mar. 7, 1989

[54] TONALITY CORRECTION METHOD

[75] Inventor: Yoshiharu Okino, Kanagawa, Japan

[73] Assignee: Fuji Photo Film Co., Ltd., Kanagawa, Japan

[21] Appl. No.: 152,711

[22] Filed: Feb. 5, 1988

[30] Foreign Application Priority Data

Feb. 5, 1987 [JP] Japan ................. 62-23688

[51] Int. Cl.⁴ ................. G03C 5/02; G03C 7/00; G03C 7/18
[52] U.S. Cl. ................. 430/30; 430/138; 430/235; 430/236; 430/359
[58] Field of Search ................. 430/30, 138, 235, 236, 430/359

[56] References Cited

U.S. PATENT DOCUMENTS

| | | | |
|---|---|---|---|
| 4,329,411 | 5/1982 | Land | 430/30 |
| 4,522,491 | 6/1985 | Ingalls et al. | 430/30 |
| 4,742,374 | 5/1988 | Yamamoto et al. | 430/138 |

Primary Examiner—Richard L. Schilling
Attorney, Agent, or Firm—Sughrue, Mion, Zinn, Macpeak, and Seas

[57] ABSTRACT

The tonality of a produced color image transferred to an image receiving material is measured. The differences between equivalent neutral shades of a reference color image and equivalent neutral shades of the reproduced color image are compared to calculate tonal correction values for corrected equivalent neutral shades. Tonality correction means is controlled on the basis of said tonal correction values.

4 Claims, 4 Drawing Sheets

TONALITY CORRECTION METHOD

BACKGROUND OF THE INVENTION

1. Field of the Invention

The present invention relates to a tonality correction method and more particularly, relates to a method for correcting the tonality of a color image in a color image recorder, in which three kinds of rays of light which are different from each other in wavelength are irradiated upon a chromatically photosensitive material having a spectral sensitivity to at least the range of visible light, to control the coloring in yellow, magenta and cyan to record the tonality-corrected color image on the chromatically photosensitive material.

2. Background Art

In one available method, in order to correct the tonality of a color image in a color image making device, the shades of yellow, magenta and cyan in coloring are observed by eyesight upon the recorded color image. At that time, the quantity of exposure to light is adjusted by a filter, for example, to compensate for any shortage or imbalance in coloring. It there is a shortage in the yellow coloring of the recorded color image, for example, a filter is disposed on an optical axis to promote the yellow coloring by rays of light to which a photosensitive material is exposed, i.e., to irradiate more rays of yellow light upon the photosensitive material. After that, image recording is performed again, and a new recorded image is observed by eyesight to judge the correction of the tonality. Such tonality correction is performed again if necessary.

The above approach is difficult, in that, the relationship in coloring among three basic colors, such as yellow, magenta and cyan, or four basic colors such as yellow, magenta, cyan and black, needs to be comprehended or grasped in order to determine the corrected quantity of the tonality through the observation of the recorded color image. In addition, it is difficult to make the spectral characteristics of the colors and that of a tonality correction means (such as a tonality correction filter) coincide with each other. For these reasons, the above approach is disadvantageous as special knowledge and experience are necessary to determine the quantity of the correction of the tonality by the tonality correction means. Therefore, there is a problem in that it is virtually impossible to easily correct the tonality.

SUMMARY OF THE INVENTION

The present invention is a tonality correction method which solves the above-mentioned problem.

Accordingly, it is an object of the present invention to provide a method of easily correcting the tonality of a recorded color image without special knowledge and experience.

DETAILED DESCRIPTION OF THE DRAWINGS

DETAILED DESCRIPTION OF THE PREFERRED EMBODIMENT

Figure 1:
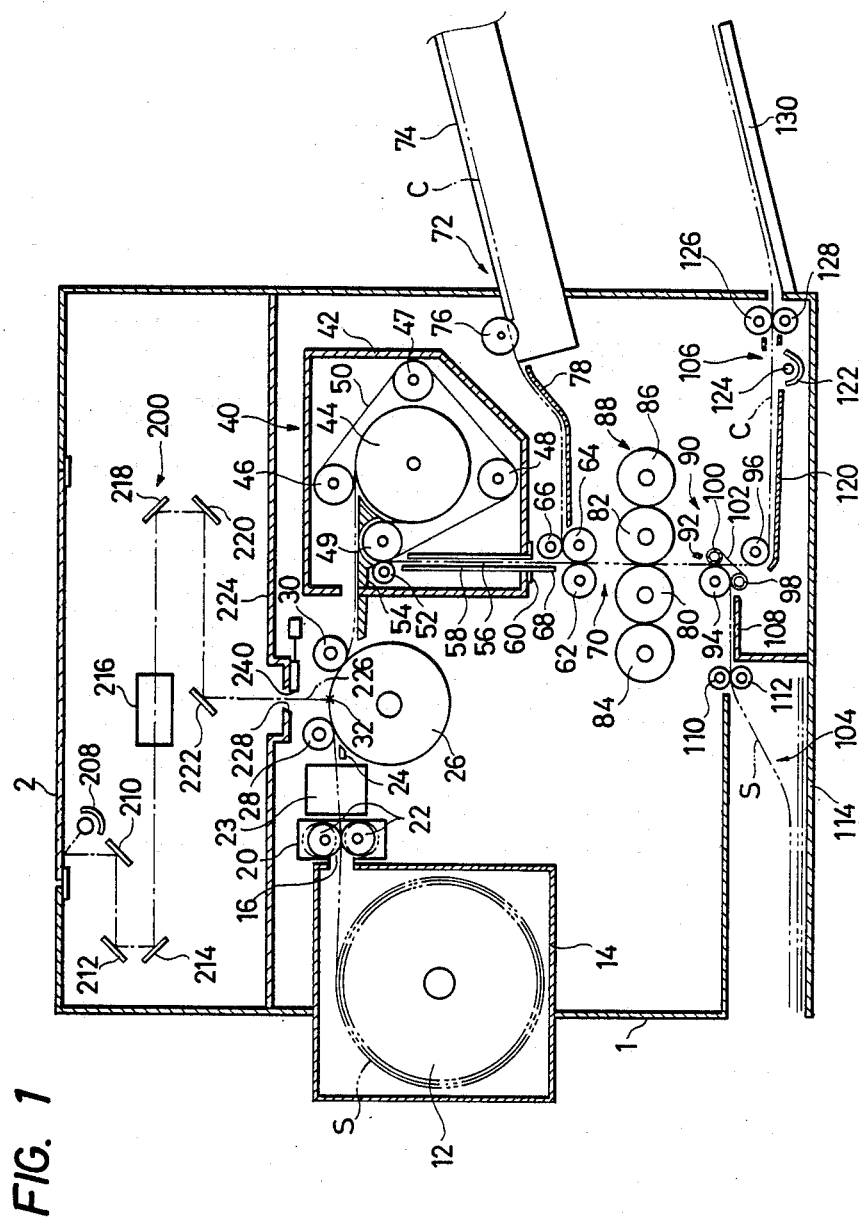
FIG. 1 shows a sectional view of an image recorder to which a method embodiment of the present invention is applied.

The method provided in accordance with the present invention is applied to a color image recorder in which three kinds of rays of light (which are different from each other in wavelength), are irradiated upon a chromatically photosensitive material having a spectral sensitivity to at least the range of visible light, to control the coloring in yellow, magenta and cyan to record the tonality-corrected color image on the chromatically photosensitive material. The method is characterized in that the tonality of the color image transferred to an image-receiving material is measured; the differences between the equivalent neutral shades of a reference color image and equivalent neutral shades based on the results of the measurement are compensated to correct the equivalent neutral shades based on the results of the measurement; and a tonality correction means is controlled depending on the corrected equivalent neutral shades. Since the corrected quantity of the tonality of the color image is calculated through the use of the equivalent neutral shades so as to control the operation of the tonality correction means, the spectral characteristics of basic colors and that of the tonality correction means practically do not need to be taken into consideration in the method. Therefore, it is easy to correct the tonality of the reproduced color image.

For the purposes of this specification, the chromatically photosensitive material is herein referred to as a material for obtaining a visible image by applying pressure to a latent image made through exposure to imagerial rays of light (i.e., rays of light corresponding to an image to be produced). Before the pressure is applied to the latent image, thermal development or wet development may be performed as a preparatory step.

One example of a suitable material is disclosed in Japanese Patent Application (OPI) No. 179836/82 (the term "OPI" as used herein means an "unexamined published application") filed by the present applicant and is of the type in which a polymerizable compound is hardened in the form of an image by exposure to imagerial rays of light and pressure is thereafter applied to the material so that a visible image is made. In the material, capsules, whose walls are made of a high-molecular synthetic resin, and which contain a vinyl compound, a photopolymerization initiator and a coloring agent precursor, are borne on a carrier.

Another example of a suitable material is disclosed in Japanese Patent Application No. 121284/85 or No. 53881/86 filed by the present applicant and is of the type in which a silver halide is contained, and development is performed on the silver halide after exposure to imagerial rays of light. A polymerizable compound is hardened at the same time as the development corresponding thereto, and pressure is thereafter applied to the material to make a visible image.

As for the material disclosed in Japanese Patent Application No. 121284/85, the transfer of a color image making substance to an image-receiving material having an image-receiving layer is performed after thermal development so as to make the image on the image-receiving material. In the material disclosed in the Application, a carrier is coated with at least a photosensitive silver halide, a reducing agent, a polymerizable compound and a color image making substance, and at least the polymerizable compound and the color image making substance are enclosed in an identical capsule.

As for the material disclosed in Japanese Patent Application No. 53881/86, the image is made on a photosensitive material but is not transferred to an image-receiving material. In the material disclosed in the application, a photosensitive layer comprising a silver halide, a reducing agent, a polymerizable compound and two kinds of substances, which perform a coloring reaction when being in contact with each other, is provided on a carrier. The polymerizable compound and one of the substances are contained in capsules, while the other substance is not contained in the capsules.

The color image recorder, to which the method provided in accordance with the present invention is applied, has a thermal developing means, if the chromatically photosensitive material is of the type in which thermal development is performed before the image is fixed by applying pressure to the material. The color image record does not have the thermal development means if the chromatically photosensitive material is of the type in which the thermal development is not performed before the image is fixed by applying pressure to the material.

One embodiment of the present invention, which is a method of correcting the tonality of a color image on a chromatically photosensitive material of the type in which thermal development is performed before pressure is applied to transfer the image, is hereafter described in detail with reference to the drawings attached hereto.

Shown in the drawings are a photosensitive material S, image-receiving paper C, a casing 1, a photosensitive material feed roller 12, a photosensitive material cartridge 14, an outlet opening 16, a cartridge-coupled dark box 20, photosensitive material send-out rollers 22, a cutter 23, a guide plate 24, an exposed photosensitive material support roller 26, photosensitive material pinch rollers 28 and 30, an exposure position 32, a thermal developing unit 40, a developing case 42, a heating roller 44, belt support rollers 46, 47, 48 and 49, a belt 50, a pinch roller 52, a guide means 54, an outlet opening 56, a vertical guide means 58, a sensor 60, pressure contact rollers 62 and 64, a pinch roller 66, a guide member 68, a photosensitive material and image-receiving paper overlaying unit 70, an image-receiving paper feeder 72, an image-receiving paper feed cassette 74, an image-receiving paper send-out roller 76, a guide plate 78, pressure pinch rollers 80 and 82, backup rollers 84 and 86, a transfer unit 88, a separation unit 90, a guide member 92, a first conveyance roller 94, a second conveyance roller 96, guide rollers 98 and 100, separation belts 102, a photosensitive material discarding section 104, a fixation unit 106, a guide member 108, conveyance rollers 110 and 112, a discarding box 114, a guide member 120, a reflector 122, a lamp 124, conveyance rollers 126 and 128, a takeout tray 130, an exposure unit 200, a partition 224, an aperture 228, a measuring unit 308, an image 401, a lamp 402, a color separation filter unit 403, photoelectric conversion elements 404, 410 and 412, a digitizing circuit 405, operational amplifiers 406, 411 and 413, an analog switch 407, a sample hold circuit 408, an A/D converter 409, a microprocessor 414, filters 417 and 418 and a light quantity regulator 419.

FIG. 1 shows a sectional view of a color image recorder to which a preferred method embodiment of the present invention is applied.

The chromatically photosensitive material is sensitive to pressure and has an effective sensitivity to rays of light which have wavelengths of about 425 nm, 532 nm and 650 nm.

As shown in FIG. 1, an exposure unit 200 is provided in the upper portion of a casing 1, the interior of which is isolated from that of the other portion thereof by a partition 224. The exposure unit 200 comprises an illumination lamp 208, mirrors 210, 212 and 214, and a focusing lens and filter assembly 216, which perform a scanning movement together under a whole glass plate 2. The exposure unit 200 further comprises mirrors 218 and 220, which are moved in the same direction as the scanning movement of the illumination lamp and so forth by a length equal to a half of the length of the scanning movement, and a fixed mirror 222.

An aperture 228 is provided around the optical axis 226 of the exposure unit 220. A shutter 240 is provided at the aperture 228.

A photosensitive material cartridge 14, in which a roller 12 on which the chromatically photosensitive material S is wound is housed, is removably attached to a side portion of the casing 1. A pair of photosensitive material send-out rollers 22, which are housed in a dark box 20 coupled to the cartridge 14, are provided at the photosensitive material outlet opening 16 of the cartridge so that the chromatically photosensitive material S wound on the roller 12 is sent out by a prescribed length. When the front edge of the photosensitive material S enters the dark box 20, the photosensitive material send-out rollers 22 are moved away from each other to positions shown by dotted lines in FIG. 1, to facilitate the proceeding of the photosensitive material.

A cutter 23 for cutting off the photosensitive material S and a guide plate 24 are provided downstream (with regard to the direction of movement or proceeding of the photosensitive material) from the dark box 20. An exposed photosensitive material support roller 26 and two photosensitive material pinch rollers 28 and 30, which are located in pressure contact with the support roller, are provided downstream from the guide plate 24. The photosensitive material S guided by the guide plate 24 is brought into tight contact with the exposed photosensitive material support roller 26 by photosensitive material pinch rollers 28 and 30, so that the photosensitive material is exposed to imagerial rays of light by the exposure unit 200, as the material is in a position 32 between the pinch rollers.

A thermal developing unit 40 is provided downstream from the support roller 26 so that the photosensitive material S exposed to the imagerial rays of light is developed by heating. The thermal developing unit 40 comprises: a developing case 42 which insulates heat; a heating roller 44 provided in the developing case so as to heat at a temperature of about 120° C.; an endless belt 50 supported by four belt support rollers 46, 47, 48 and 49 and wound on the peripheral surface of the heating roller by a length corresponding to a circumferential angle of about 270°; a pinch roller 52 in pressure contact with the support roller 49; a guide means 54 which functions so that the photosensitive material S sent from the exposed photosensitive material support roller 26 is guided onto the heating roller 44 and that the material is separated from the heating roller after the material is developed by heating; a vertical guide means 58 which functions so that the material S already developed by heating and sent by the support roller 49 and the pinch roller 52 is guided to an outlet opening 56; and a photosensitive material front edge detection sensor 60 provided at the outlet opening.

A photosensitive material and image-receiving paper overlaying unit 70 comprises: a pair of pressure contact rollers 62 and 464; a pinch roller 66 in pressure contact with the pressure contact roller 64; and a guide member 68 which functions so that image-receiving paper C sent by the pressure contact roller 64 and the pinch roller 66 is guided to the mutual contact portions of the pressure contact rollers 62 and 64 which are provided directly under the outlet opening 56.

An image-receiving paper feeder 72 is provided at a side of the photosensitive material and image-receiving paper overlaying unit 70. The image-receiving paper feeder 72 comprises: an image-receiving paper feed cassette 74 removably attached to the casing 1 and projecting therefrom; an image-receiving paper send-out roller 76 for sending out the image-receiving paper C from the cassette; and a guide plate 78 which functions so that the image-receiving paper C sent out by the send-out roller is guided to the mutual contact portions of the pressure contact roller 64 and the pinch roller 66.

The width of the image-receiving paper C is less by about 6 mm than that of the chromatically photosensitive material S. The paper C is overlaid on the central portion of the material S with regard to the direction of the width of the material by the overlaying unit 70.

A transfer unit 88, which comprises a pair of pressure pinch rollers 80 and 82 and backup rollers 84 and 86 for uniforming the pressure of the pressure pinch rollers in the axial directions thereof, is provided under the photosensitive material and image-receiving paper overlaying unit 70. The pressure pinch rollers 80 and 82 are placed in contact with each other under a pressure of about 500 kg/cm².

A photosensitive material and image-receiving paper separation unit 90 is provided under the transfer unit 88. The separation unit 90 comprises a guide member 92, a first conveyance roller 94, a second conveyance roller 96, and separation belts 102 wound on guide rollers 98 and 100 so as to be in pressure contact with both the side edges of only the photosensitive material S on the first conveyance roller.

A photosensitive material discarding section 104 is provided at a side of the separation unit 90. The discarding section 104 comprises a guide member 108, a pair of conveyance rollers 110 and 112, and a discarding box 114. The photosensitive material S sent from the separation unit 90 and guided by the guide member 108 is entered into the discarding box 114 by the conveyance rollers 110 and 112.

A fixation unit 106 is powered at another side of the separation unit 90. The fixation unit 106 comprises a guide member 120, an ultraviolet ray irradiation lamp 124 provided with a reflector 122, and a pair of conveyance rollers 126 and 128, so that the image-receiving paper C sent from the separation unit 90 and guided by the guide member 120 is irradiated with ultraviolet rays for about five second to fix the color image on the paper.

A takeout tray 130, which receives the image-receiving paper C, is fitted downstream from the fixation unit 106 so that the takeout tray projects from the casing 1.

Figure 2:
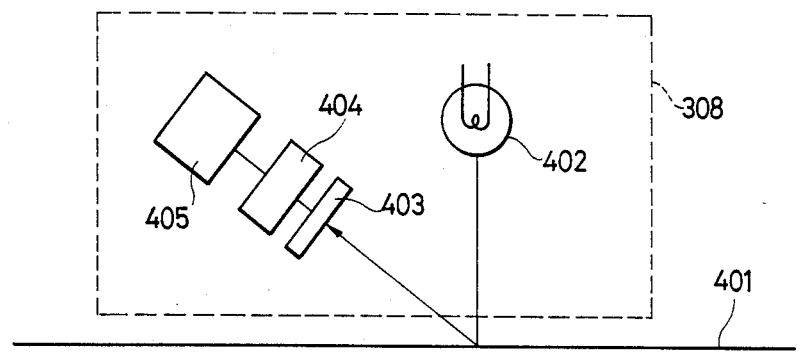
FIG. 2 shows a schematic view of a measuring unit.

FIG. 2 shows a schematic view of a measuring unit 308 for measuring the tonality of the color image to be recorded.

Figure 3:
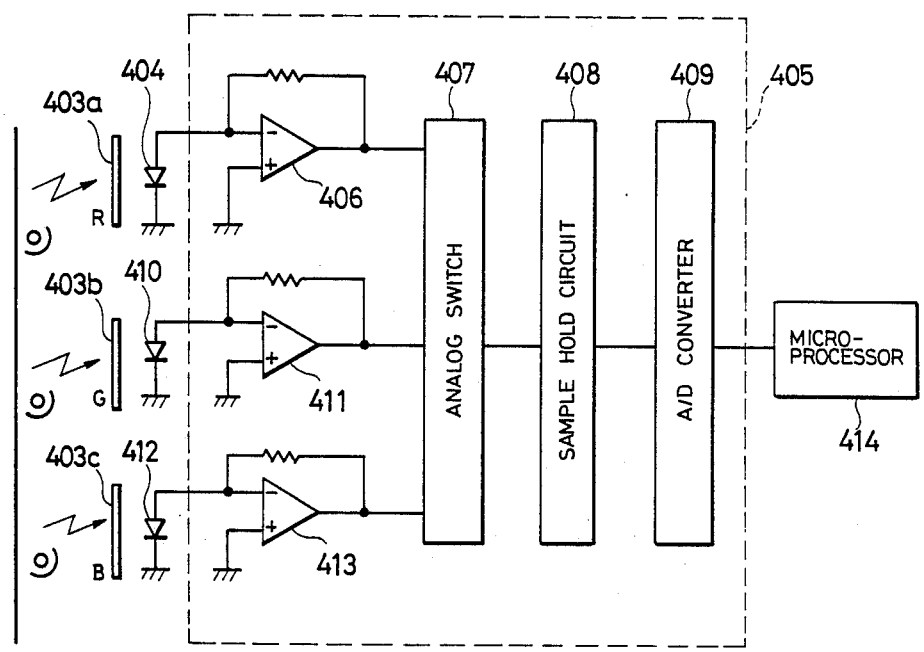
FIG. 3 shows a block diagram of a digitizing circuit.

FIG. 3 shows a block diagram of a circuit 405 for digitizing the results of the measurement.

As one example, the measuring unit 308 can be provided in the color image recorder. The measuring unit 308 functions so that: light is irradiated upon the color image 401 by a lamp 402; the light reflected from the image is divided by a color separator filter unit 403; a divided portion of the light is converted into an analog signal by a photoelectric conversion element 404 such as a photodiode and an amorphous silicon diode; and the analog signal is digitized by the digitizing circuit 405.

FIG. 3 also shows filters 403a, 403b and 403c through which red, green and blue rays of light are transmitted, respectively, and photoelectric conversion elements 404, 410 and 412 which convert the rays of light into electrical currents, respectively. The photoelectric conversion element 404 converts the red rays of light into electrical current, and the electric current is supplied to an operational amplifier 406 which converts the electrical current into a voltage. The photoelectric conversion element 410 converts the green rays of light into the electrical current which is converted into a voltage by an operational amplifier 411. The photoelectric conversion element 412 converts the blue rays of light into the electrical current which is converted into a voltage by an operational amplifier 413. An analog switch 407, a sample hold circuit 408 and an A/D (which stands for analog/digital) converter 409 are further provided. A microprocessor 414 calculates the equivalent neutral shades of the tonality of the color image in terms of the measurement results each quantized to eight bits, for example, by the A/D converter 409, so that the microprocessor performs an operation for compensating the differences between the calculated equivalent neutral shades and the equivalent neutral shades of the tonality of a reference image, which is made by recording a standard white plate provided in an effective field of vision which is established when the illumination lamp 208 of the exposure unit 200 is in a returned position. When the standard white plate is recorded, filters are in standard positions and a light quantity regulator is in such a position as to make the quantity of exposure of the standard white plate smaller than a normal value.

Figure 4:
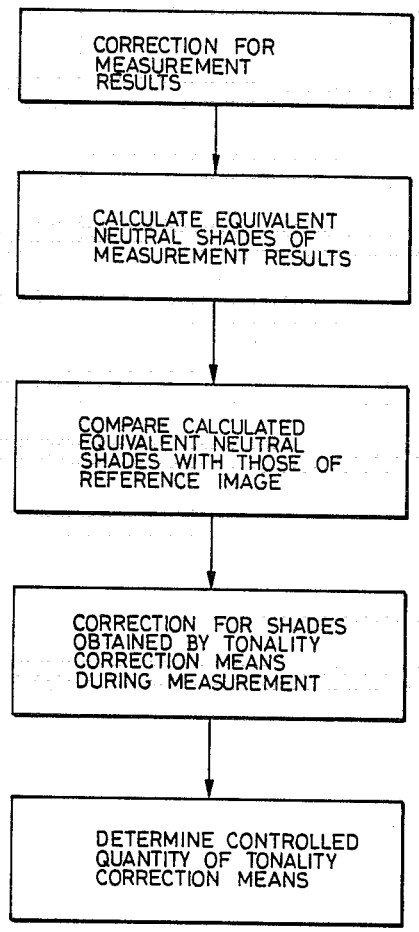
FIG. 4 shows a flow chart of one method of the present invention which results in the correction of tonality.

The operation of the microprocessor 414 is now described with reference to FIG. 4. In order to remove mixed color components from the measurement results $S_R$, $S_G$ and $S_B$ quantized by the digitizing circuit 405, the reflectance (or the shade of coloring) of each of the basic colors at the maximum absorption wavelength thereof is determined in accordance with a formula below.

$$\begin{bmatrix} R \\ G \\ B \end{bmatrix} = \begin{bmatrix} a_{11} & a_{12} & a_{13} \\ a_{21} & a_{22} & a_{23} \\ a_{31} & a_{32} & a_{33} \end{bmatrix} \begin{bmatrix} S_R \\ S_G \\ S_B \end{bmatrix}$$

The reference image of the standard white plate is set at a reflectance of 0.5 (or at an equivalent neutral shade of 0.3), for example, over the entire range of wavelength by the light quantity regulator. The regulated quantity of light and the inserted quantities of the two filters for correcting the tonality of the color image to be recorded are determined on the basis of the coloring shades R, G and B of the basic colors. However, since the spectral characteristics of the basic colors and those of the tonality correction filters differ from each other, the regulated quantity of light and the inserted quantities of the filters need to be determined in consideration of the difference. For that purpose, the equivalent neutral shades $E_C$, $E_M$ and $E_Y$ are first determined in terms of the coloring shades R, G and B. The determination can be easily done by using a conversion table created beforehand through experimentation or calculation, and as one example, it is herein assumed that the equivalent neutral shades are as follows:

$E_C = 0.11$, $E_M = 0.36$ and $E_Y = 0.16$

The differences $\Delta E_C$, $\Delta E_M$ and $\Delta E_Y$ between the equivalent neutral shades $E_C$, $E_M$ and $E_Y$ and that (which is 0.3) of the reference image are then determined as follows:

$\Delta E_C = 0.19$, $\Delta E_M = -0.06$ and $\Delta E_Y = 0.14$

The equivalent neutral shades and a light quantity regulation shade, which are set by the filters and the light quantity regulator to perform the measurement, are then corrected in terms of the determined differences. If the set light quantity regulation shade and the set equivalent neutral shades of cyan, magenta and yellow are 0.1, 0.1 and 0, respectively, the corrected equivalent neutral shades $\Delta E_{C'}$, $\Delta E_{M'}$ and $\Delta E_{Y'}$ are as follows:

$\Delta E_{C'} = 0.1 + 0.19 = 0.29$ $\Delta E_{M'} = 0.1 - 0.06 = 0.04$ $\Delta E_{Y'} = 0 + 0.14 = 0.14$ Values obtained by subtracting the least ($E_{min'} = 0/04$) of the corrected equivalent neutral shades from them as expressed below are used as equivalent neutral shades $\Delta E_{C''}$, $\Delta E_{M''}$ and $\Delta E_{Y''}$ set by the already-corrected filters.

$\Delta E_{C''} = 0.29 - 0.04 = 0.25$ $\Delta E_{M''} = 0.04 - 0.04 = 0$ $\Delta E_{Y''} = 0.14 - 0.04 = 0.10$ A value obtained by adding the least ($E_{min'} - 0.04$) of the corrected equivalent neutral shades to the light quantity regulator shade of 0.1 set to perform the measurement is used as a light quantity regulator shade RS set by the already-corrected light quantity regulator.

$RS = 0.1 + 0.04 = 0.14$

The shade of the light quantity regulator and the equivalent neutral shades of the filters, which are set as a result of th correction of the tonality of the color image to be recorded, are thus calculated in consideration of the spectral characteristics of the basic colors and the filters. The regulated quantity of light and the inserted quantities of the filters, which correspond to the calculated shades, are determined to control the operation of a tonality corrector. The regulated quantity of light and the inserted quantities of the filters can be easily determined by using a conversion table created through experimentation or calculation.

Figure 5:
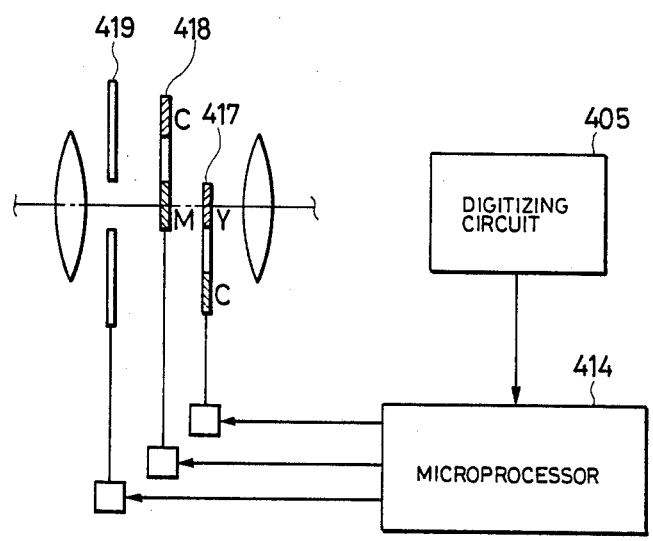
FIG. 5 shows a block diagram of one exemplary filter and light regulator arrangement which can be used for the correction of tonality.

FIG. 5 shows a block diagram of an examplary apparatus useable for the correction of the tonality of the color image to be recorded. The microprocessor 414 performs a correction operation on the basis of measurement results sent from the digitizing circuit 405, to control the operation of the filters 417 and 418 and the light quantity regulator 419. The filter 417 has a transparent portion between a yellow portion and a cyan portion. The filter 418 has a transparent portion between a cyan portion and a magenta portion.

Although the tonality of the color image to be recorded is corrected through the use of the light quantity regulator and the two filters in the above-described embodiment, the present invention is not confined thereto but may be otherwise embodied so as to correct the tonality of the color image, not through the use of the light quantity regulator and the two filters, but through the use of three filters. In the other embodiment, the differences between the equivalent neutral shades of the results of the measurement and those of the reference color image are determined so that equivalent neutral shades set by the three filters to perform the measurement are corrected. When the set equivalent neutral shades of cyan, magenta and yellow are 0.2, 0.2 and 0.1, respectively, for example, the corrected equivalent neutral shades $\Delta E_{C'}$, $\Delta E_{M'}$ and $\Delta E_{Y'}$ are as follows:

$\Delta E_{C'} = 0.2 + 0.19 = 0.29$ $\Delta E_{M'} = 0.2 - 0.06 = 0.14$ $\Delta E_{Y'} = 0.1 + 0.14 = 0.24$ The inserted quantities of the three filters, which correspond to the corrected equivalent neutral shades, are determined by using a conversion table, to control the operation of the tonality corrector.

According to the present invention, the tonality of a color image transferred to an image-receiving material is measured and then converted into equivalent neutral shades, which are compared with those of a reference image, to determine the controlled quantity of a tonality correction means. For that reason, even if the spectral characteristics of basic colors and that of the tonality correction means differ from each other, the tonality can be properly and easily corrected without special knowledge and experience, through compensation for the difference.

I claim:

1. A method for correcting the tonality of a color image in a color image recorder, in which three kinds of rays of light which are different from each other in wavelength are irradiated upon a chromatically photosensitive material having a spectral sensitivity to at least the range of visible light, to control the coloring of said color image on said material, said method comprising the steps of:

measuring the tonality of a produced color image transferred to an image receiving material;

calculating tonal correction values for corrected equivalent neutral shades by comparing the differences between equivalent neutral shades of a reference color image and equivalent neutral shades of said produced color image; and controlling tonality correction means on the basis of said tonal correction values.

2. A method as claimed in claim 1 wherein the tonality of the color image is corrected according to the colors of yellow, magenta and cyan.

3. A method as claimed in claim 1, comprising the further steps of:
measuring the tonality of a reference color image;
calculating equivalent neutral shades of said reference color image; and
calculating equivalent neutral shades of said color image.

4. A method as claimed in claim 1, wherein said controlling step comprises operations corresponding to the control of color filters and light quantity means disposed to intersect a path of said rays of light.

* * * * *